United States Patent
Hitsuoka (10) Patent No.: US 10,321,566 B2
(45) Date of Patent: Jun. 11, 2019

(54) PRINTED WIRING BOARD AND METHOD OF MANUFACTURING THE SAME

(71) Applicant: TOPPAN PRINTING CO., LTD., Tokyo (JP)

(72) Inventor: Yasuyuki Hitsuoka, Tokyo (JP)

(73) Assignee: TOPPAN PRINTING CO., LTD., Tokyo (JP)

( * ) Notice: Subject to any disclaimer, the term of this patent is extended or adjusted under 35 U.S.C. 154(b) by 0 days.

(21) Appl. No.: 15/683,138

(22) Filed: Aug. 22, 2017

(65) Prior Publication Data

US 2017/0354034 A1 Dec. 7, 2017

Related U.S. Application Data

(63) Continuation of application No. PCT/JP2016/000898, filed on Feb. 19, 2016.

(30) Foreign Application Priority Data

Feb. 23, 2015 (JP) ................................ 2015-032759

(51) Int. Cl.
*H05K 1/11* (2006.01)
*H05K 1/09* (2006.01)
(Continued)

(52) U.S. Cl.
CPC ........... *H05K 1/115* (2013.01); *H05K 3/0032* (2013.01); *H05K 3/423* (2013.01); *H05K 3/425* (2013.01);
(Continued)

(58) Field of Classification Search
CPC .......... H05K 2201/09827; H05K 2201/09845; H05K 1/115; H05K 3/0032; H05K 3/423;
(Continued)

(56) References Cited

U.S. PATENT DOCUMENTS

| | | | | |
|---|---|---|---|---|
| 6,107,109 A | * | 8/2000 | Akram | H01L 21/486 257/E21.511 |
| 6,426,642 B1 | * | 7/2002 | Akram | G01R 1/0483 257/730 |
| 6,468,889 B1 | * | 10/2002 | Iacoponi | H01L 21/76898 257/E21.597 |
| 9,516,753 B2 | * | 12/2016 | Hara | H05K 3/423 |

(Continued)

FOREIGN PATENT DOCUMENTS

| | | |
|---|---|---|
| JP | 05-152744 | 6/1993 |
| JP | 09-017828 | 1/1997 |

(Continued)

OTHER PUBLICATIONS

International Search Report issued in International Application No. PCT/JP2016/000898 dated May 10, 2016.

*Primary Examiner* — Roshn K Varghese
(74) *Attorney, Agent, or Firm* — Foley & Lardner LLP (57) ABSTRACT

A printed wiring board according to an aspect of the present invention includes an insulating resin, a plated copper formed on a front surface side of the insulating resin, and a plated copper formed on a back surface side of the insulating resin. The plated copper and the plated copper are electrically connected via a plated copper that fills a through hole penetrating the insulating resin from the front surface side to the back surface side. Furthermore, the through hole includes a conical section whose opening diameter decreases from the front surface side to the back surface side of the insulating resin, and a cylindrical section that communicates with the conical section at a bottom surface of the conical section.

9 Claims, 6 Drawing Sheets

(51) Int. Cl.
*H05K 3/00* (2006.01)
*H05K 3/42* (2006.01)

(52) U.S. Cl.
CPC ............... *H05K 3/426* (2013.01); *H05K 1/09* (2013.01); *H05K 3/0035* (2013.01); *H05K 3/427* (2013.01); *H05K 2201/09827* (2013.01); *H05K 2201/09854* (2013.01); *H05K 2203/107* (2013.01); *H05K 2203/1572* (2013.01)

(58) Field of Classification Search
CPC .................. H05K 3/425; H05K 3/426; H05K 2201/09854; H01L 21/486
USPC ...................................................... 29/88.043
See application file for complete search history.

(56) References Cited

U.S. PATENT DOCUMENTS

| | | | |
|---|---|---|---|
| 2010/0163297 A1* | 7/2010 | Kajihara | H05K 3/0032 174/264 |
| 2012/0231179 A1* | 9/2012 | Yu | H05K 3/0035 427/555 |
| 2015/0156874 A1* | 6/2015 | Hasegawa | H05K 1/115 174/266 |

FOREIGN PATENT DOCUMENTS

| | | |
|---|---|---|
| JP | 2002-064271 | 2/2002 |
| JP | 4248353 | 4/2009 |
| JP | 4963495 | 6/2012 |

* cited by examiner

PRINTED WIRING BOARD AND METHOD OF MANUFACTURING THE SAME

CROSS-REFERENCE TO RELATED PATENT APPLICATIONS

This application is a continuation application filed under 35 U.S.C. § 111(a) claiming the benefit under 35 U.S.C. §§ 120 and 365(c) of International Application No. PCT/JP2016/000898, filed on Feb. 19, 2016, which is based upon and claims the benefit of priority of Japanese Patent Application No. 2015-032759, filed on Feb. 23, 2015, the entireties of which are hereby incorporated by reference.

TECHNICAL FIELD

The present invention relates to a printed wiring board and a method of manufacturing the same.

BACKGROUND

Some printed wiring boards include, for example, an insulating layer with a through hole penetrating the entire thickness of the insulating layer, and a conductor filling the through hole.

PTL 1 and 2, for example, describe exemplary technologies relating to such printed wiring boards and methods of manufacturing the same.

CITATION LIST

Patent Literature

PTL 1: JP 4248353 B
PTL 2: JP 4963495 B

SUMMARY OF THE INVENTION

Technical Problem

With the conventional printed wiring boards and methods of manufacturing them, it may be difficult to increase the efficiency of filling a through hole with a conductor, and to achieve connection reliability.

The present invention has been made to attempt to improve or even solve the above problems. An object of the present invention is to provide a printed wiring board that improves circulation of a plating solution into a through hole without special apparatuses, may improve the efficiency of filling the through hole with a conductor, and/or improve connection reliability, and a method of manufacturing the same.

Solution to Problem

To attempt to improve or even solve the above problems, a printed wiring board according to an aspect of the present invention includes an insulating layer, a first conductive layer formed on one surface side of the insulating layer, and a second conductive layer formed on the other surface side of the insulating layer. The first and second conductive layers are electrically connected via a conductor that fills a through hole penetrating the insulating layer from the one surface side to the other. The through hole includes a tapered section and a cylindrical section. The tapered section has an opening diameter decreasing from the one surface side to the other of the insulating layer, and has a minimum opening diameter section. The cylindrical section communicates with the tapered section at the minimum opening diameter section.

Advantageous Effects of Invention

According to the aspect of the present invention, the printed wiring board may improve the efficiency of filling the through hole with the conductor, and/or improve connection reliability.

DESCRIPTION OF REPRESENTATIVE EMBODIMENTS

An embodiment of the present invention will now be described with reference to the accompanying drawings. The detailed description below focuses on specific details of the embodiment of the present invention in order to provide a complete understanding thereof. It is apparent, however, that one or more embodiments can be implemented without the specific details. The embodiments described below are representative of the present invention. To simplify the drawing, well-known structures and apparatuses may be schematically illustrated.

(Structure of Printed Wiring Board)

Figure 2A:
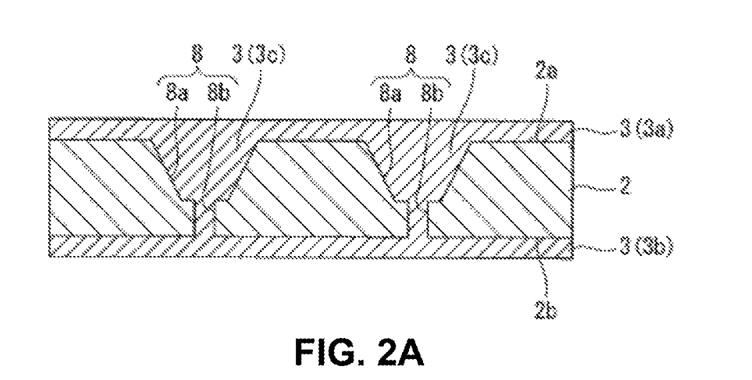
FIGS. 2A through 2C are a set of diagrams illustrating a method of manufacturing the printed wiring board (partially shown) according to the embodiment of the present invention.

A printed wiring board according to the embodiment of the present invention has a stack of alternating conductive and insulating layers. The printed wiring board includes a through hole for providing electrical continuity between two or more conductive layers. The through hole has a section decreasing in opening diameter from one surface side toward the other of the insulating layer, with the remaining section of the through hole having a cylindrical shape extending toward the other surface side. More specifically, as shown in FIG. 2A, the printed wiring board according to an embodiment of the present invention includes an insulating resin (the insulating layer) 2, plated copper (the first conductive layer) 3a formed on a front surface (one surface) 2a side of the insulating resin 2, and plated copper (the second conductive layer) 3b formed on a back surface (the other surface) 2b side of the insulating resin 2. The plated copper 3a and 3b are electrically connected via plated copper (the conductor) 3c that fills a through hole 8 penetrating the insulating resin 2 from the front surface 2a side to the back surface 2b side. Furthermore, the through hole 8 includes a conical section (the tapered section) 8a and a cylindrical section 8b. The conical section 8a has an opening diameter decreasing from the front surface 2a side to the back surface 2b side of the insulating resin 2, and has a minimum opening diameter section. The cylindrical section 8b communicates with the minimum opening diameter section.

The conical section 8a of decreasing opening diameter is formed on one surface side (for example, the front surface 2a side), and then the cylindrical section 8b is formed. This configuration allows the through hole 8 to have a shape without misalignment between the conical section 8a and the cylindrical section 8b. When the through hole 8 is filled with the plated copper 3c by electrolytic copper plating, the cylindrical section 8b of the through hole 8 is plugged with a small amount of plating early in the plating process. This allows the through hole 8 to have a bottom made of the plated copper 3, as with a normal via, when viewed from the front surface 2a side where the through hole 8 has a larger opening diameter. Then, the through hole 8 is better filled with the plated copper 3 than when using conventional, proven methods of filling vias. With the printed wiring board according to the present embodiment and the method of manufacturing the same, the through hole 8 is easily plugged and connection reliability is improved.

(Method of Manufacturing Printed Wiring Board)

A method of manufacturing the printed wiring board according to the present embodiment will now be described in detail.

Figure 1A:
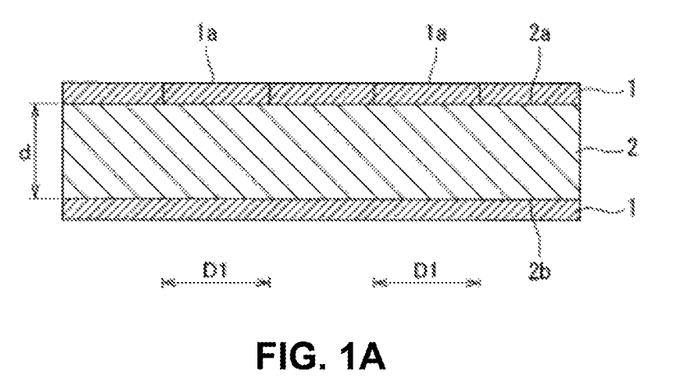
FIGS. 1A through 1E are a set of diagrams illustrating a method of manufacturing a printed wiring board (partially shown) according to an embodiment of the present invention.

FIG. 1A is a schematic cross-sectional view of a laminate. To form this laminate, a copper foil 1, the insulating resin 2, and another copper foil 1 are stacked in that order, followed by thermocompression bonding. The insulating resin 2 has a thickness d in a range of 60 μm to 200 μm. The term "copper foil 1a" will be used to refer to a copper foil disposed in a region where the through hole 8 (described later) is to be formed. The region is also referred to hereinafter as "through hole-forming region".

Figure 1B:
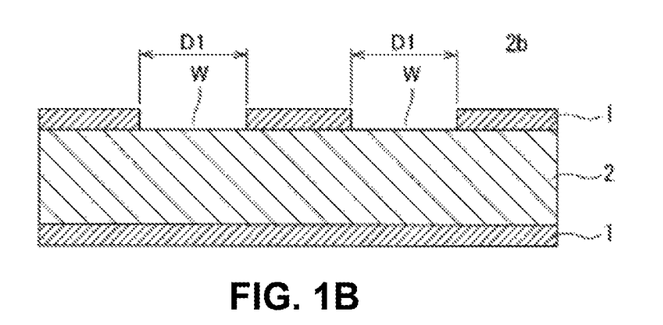

FIG. 1B is a schematic cross-sectional view of the laminate, where the copper foil 1a in the through hole-forming region has been removed. As shown in FIG. 1B, a subtractive process, which is a known technology, for example, can be used to selectively remove a portion of the copper foil 1, that is, to remove the copper foil 1a in the through hole-forming region, to form a window section W in the copper foil 1. Specifically, a resist pattern (not shown) is formed on the copper foil 1 such that a front surface of the copper foil 1a in the through hole-forming region is exposed. Then, the copper foil 1a is etched away. Lastly, the resist on the copper foil 1 is stripped. The window section W in the copper foil 1 preferably has an opening diameter D1 in a range of more than 60 μm to 120 μm or less.

Figure 1C:
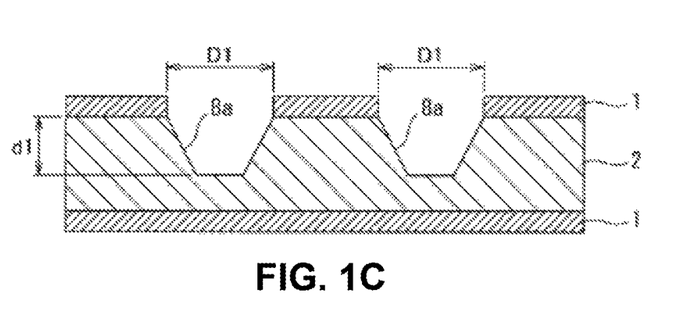

FIG. 1C is a schematic cross-sectional view of the laminate, where the insulating resin 2 exposed through the window section W, shown in FIG. 1B, has been subjected to first laser beam machining. As shown in FIG. 1C, after the copper foil 1a has been removed to form the window section W in the copper foil 1, the insulating resin 2 exposed through the window section W is irradiated with a laser beam, to form a conical hole having a depth d1, that is, the conical section 8a, in the insulating resin 2 (the first laser beam machining). In other words, the first laser beam machining includes irradiating the insulating resin 2 with a laser beam, to form the conical section 8a in the insulating resin 2 such that the conical section 8a does not penetrate the insulating resin 2. Preferably, the depth d1 of the conical section 8a is at least 30 μm less than the thickness d of the insulating resin 2. The conical section 8a thus formed has a maximum opening diameter approximately equal to the opening diameter D1 of the window section W.

Figure 1D:
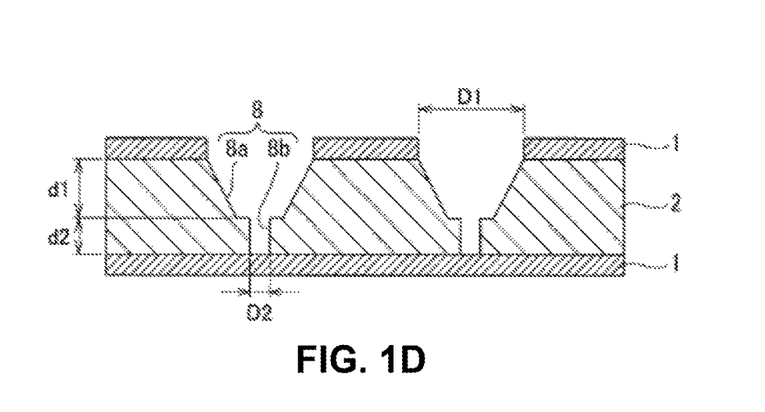

FIG. 1D is a schematic cross-sectional view of the laminate, where a bottom surface of the conical section 8a, shown in FIG. 1C, has been subjected to second laser beam machining. As shown in FIG. 1D, after formation of the conical section 8a in the insulating resin 2, a cylindrical hole having a depth d2, that is, the cylindrical section 8b, is formed in the insulating resin 2 so as to communicate with the conical section 8a. In other words, the second laser beam machining includes irradiating the bottom surface of the conical section 8a (that is, a minimum opening diameter section that has a minimum opening diameter in the conical section 8a) with a laser beam from the front surface 2a side, to form the cylindrical section 8b in the insulating resin 2 that communicates with the conical section 8a and penetrates the insulating resin 2.

The cylindrical section 8b thus formed has an opening diameter D2 in a range of 30 μm or more to 60 μm or less, and has a depth d2 in a range of 30 μm or more to 60 μm or less. If the opening diameter D2 and the depth d2 of the cylindrical section 8b exceed the above upper limits, a large amount of the plated copper 3c may be required to fill the through hole 8 that includes the conical section 8a and the cylindrical section 8b. On the other hand, if the opening diameter D2 and the depth d2 of the cylindrical section 8b are less than the above lower limits, connection reliability in the through hole 8 may not be achieved.

Figure 1E:
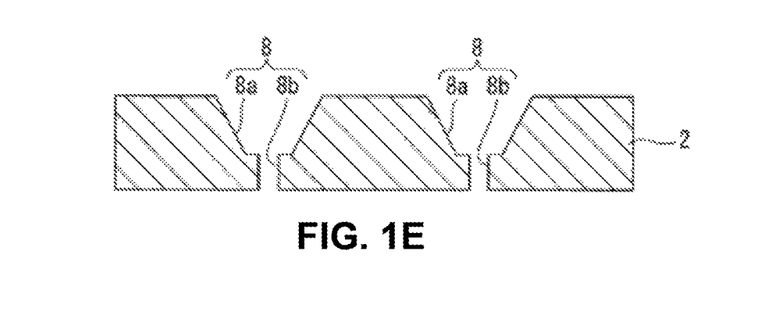

FIG. 1E is a schematic cross-sectional view of the laminate, where the copper foil 1 has been removed after formation of the through hole 8 shown in FIG. 1D. As shown in FIG. 1E, after formation of the through hole 8 that includes the conical section 8a and the cylindrical section 8b in the insulating resin 2, the copper foil 1 is removed. Then, to achieve electrical conduction between the front and back surfaces 2a and 2b of the insulating resin 2, a thin layer of copper is deposited on the entire surface of the insulating resin 2 by electroless copper plating. In other words, electroless copper plating is performed on the insulating resin 2 formed with the through hole 8, to form a thin copper film (not shown) on the entire exposed surface of the insulating resin 2.

FIG. 2A is a schematic cross-sectional view of the laminate, where the through hole 8 has been filled with the plated copper 3c. After formation of the thin copper film (not shown) on the entire exposed surface of the insulating resin 2, a filled-via plating bath is used, for example, to perform electro copper plating on the insulating resin 2 in which the through hole 8 is formed. The through hole 8 is thereby filled with the plated copper 3c, as shown in FIG. 2A. Thus the cylindrical section 8b of the through hole 8 is filled with the plated copper 3c early in the electro copper plating. The conical section 8a, as with a normal via, has a bottom made of the plated copper 3c when viewed from the front surface 2a side. Then, the via is filled with the plated copper 3c using a conventional technology.

As a process done after the electroless copper plating has been performed on the insulating resin 2 formed with the through hole 8, a "semi-additive" process may be selected.

Figure 2B:
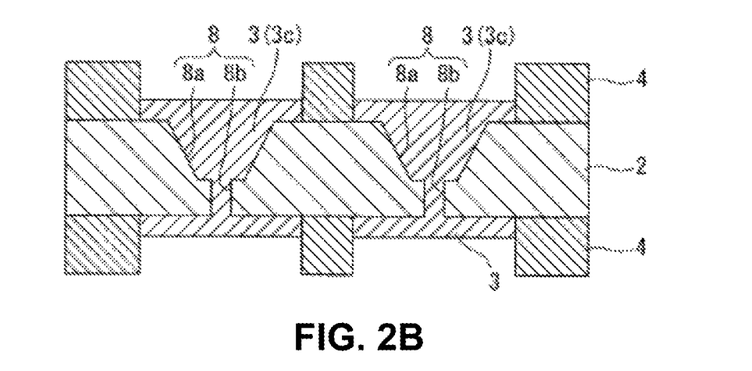
Figure 2C:
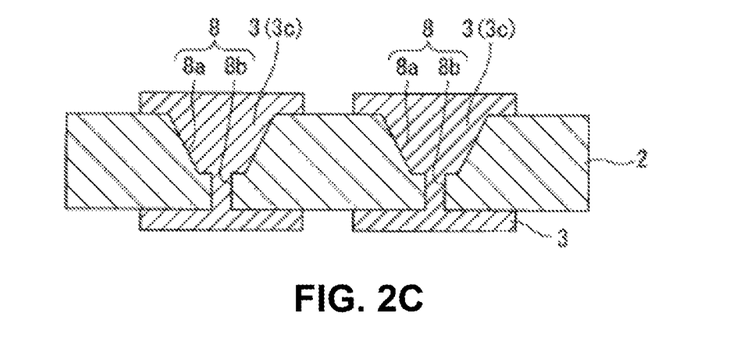

In that case, as shown in FIG. 2B and FIG. 2C, a plating resist pattern is formed, and the through hole 8 is filled with the plated copper 3c simultaneously with the formation of a wiring pattern by pattern plating. More specifically, the insulating resin 2 shown in FIG. 1E is formed, and then electroless copper plating is performed to deposit a thin layer of copper (not shown) on the entire exposed surface of the insulating resin 2. Then, a dry film resist 4 is disposed on both the front and back surfaces 2a and 2b of the insulating resin 2. As shown in FIG. 2B, a wiring pattern is then formed at the dry film resist, and the through hole 8 and a space between the patterns of the dry film resist 4 are filled with the plated copper 3c by electro copper plating. As shown in FIG. 2C, the dry film resist 4 and the thinly deposited copper (not shown) are then both removed.

Alternatively, as a process done after formation of the insulating resin 2 shown in FIG. 1E, a "subtractive" process may be selected. In that case, electroless copper plating is performed to deposit a thin layer of copper (not shown) on the entire exposed surface of the insulating resin 2, electro copper plating is performed to uniformly coat the entire surface of the deposited copper with the plated copper 3, a pattern of an etching resist is then formed, followed by etching to form a wiring pattern.

The embodiment of the present invention described above is merely illustrative, and does not intend to limit the present invention. Accordingly, the present invention can be modified without departing from its gist.

(Variation)

In the embodiment, the hole (window section W) in the copper foil 1 on one surface (for example, the front surface 2a) of the laminate is formed by the subtractive process, and the window section W is laser-machined to form the through hole 8. This, however, is not limiting to the present invention. For example, the copper foil 1 may be etched away first, and then the through hole-forming region may be directly subjected to the first and second laser beam machining to form the through hole 8 in the insulating resin 2.

EXAMPLES

Examples and Comparative Examples of the present invention will now be described.

Example 1

The steps below were used to manufacture a laminate including a through hole 8.

A double-sided copper clad laminate MCL-E-679FG from Hitachi Chemical Co., Ltd. (insulating layer thickness: 150 µm; primer-coated copper foil thickness: 12 µm) was used. Each of the copper foils 1 on both surfaces of the laminate was thinned to a thickness of 6 µm with a sulfuric acid peroxide mixture-based etching solution. This produces the laminate having the copper foils 1 with a thickness of 6 µm, as shown in FIG. 1A.

A hole (window section W) having an opening diameter D1 of 100 µm was then formed on the copper foil 1 using the subtractive process. Thus the laminate shown in FIG. 1B was obtained.

As the first laser beam machining, the insulating resin 2 exposed through the hole (window section W) was then irradiated with a UV-YAG laser beam (spot diameter: 110 µm), to form a conical hole having an opening diameter of 100 µm, that is, the conical section 8a. Thus the laminate shown in FIG. 1C was obtained. In the present example, the conical section 8a had a depth d1 of 100 µm.

As the second laser beam machining, the insulating resin 2 formed with the conical section 8a was irradiated with a UV-YAG laser beam (spot diameter: 40 µm), to form a cylindrical hole having an opening diameter D2 of 50 µm, that is, the cylindrical section 8b. The through hole 8 including the conical section 8a and the cylindrical section 8b was thereby formed. Thus the laminate shown in FIG. 1D was obtained. In the present example, the cylindrical section 8b had a depth d2 of 50 µm, and an aspect ratio (the depth d2/the opening diameter D2) of 1.0.

The copper foils 1 were removed with a sulfuric acid peroxide mixture-based etching solution. The insulating resin 2 shown in FIG. 1E was thus obtained.

The insulating resin 2 was desmeared. In this desmearing process, the insulating resin 2 was immersed in a mixed aqueous solution (at 70 degrees) of 60 g/L of potassium permanganate and 15 g/L of potassium manganate for 30 minutes. Then, electroless copper plating (1.0 µm) and electro copper plating (20 µm) were successively performed. Thus, the through hole 8 was filled with the plated copper 3c; at the same time, the plated copper 3a and the plated copper 3b were respectively disposed on the front and back surfaces 2a and 2b of the insulating resin 2, to establish interlayer electrical conduction. The laminate (printed wiring board) shown in FIG. 2A was thus obtained.

In the laminate (printed wiring board) of Example 1 thus manufactured, the through hole 8 was filled with the plated copper 3c without a cavity therein.

Example 2

A laminate (printed wiring board) of Example 2 was obtained in the same manner as Example 1, except that a double-sided copper clad laminate was used which had a 60 um-thick insulating layer; a conical section 8a had a depth d1 of 30 µm; and a cylindrical section 8b had a depth d2 of 30 µm and an opening diameter D2 of 30 µm.

Example 3

A laminate (printed wiring board) of Example 3 was obtained in the same manner as Example 1, except that a double-sided copper clad laminate was used which had a 100 µm-thick insulating layer; a conical section 8a had a depth d1 of 150 µm; and a cylindrical section 8b had a depth d2 of 50 µm and an opening diameter D2 of 50 µm.

Example 4

A laminate (printed wiring board) of Example 4 was obtained in the same manner as Example 1, except that a double-sided copper clad laminate was used which had a 200 µm-thick insulating layer; a conical section 8a had a depth d1 of 150 µm; and a cylindrical section 8b had a depth d2 of 40 µm and an opening diameter D2 of 60 µm.

Comparative Example 1

A laminate (printed wiring board) of Comparative Example 1 was obtained in the same manner as Example 1, except that a double-sided copper clad laminate had a 150 µm-thick insulating layer; a conical section 8a had a depth d1 of 60 µm; and a cylindrical section 8b had a depth d2 of 90 µm and an opening diameter D2 of 60 µm.

The laminate (printed wiring board) of Comparative Example 1 thus manufactured had a cavity in plated copper 3c that filled the cylindrical section 8b.

Comparative Example 2

A laminate (printed wiring board) of Comparative Example 2 was obtained in the same manner as Example 1, except that a double-sided copper clad laminate had a 170 µm-thick insulating layer; and the double-sided copper clad laminate was irradiated with a UV-YAG laser beam from one surface side thereof, to form an approximately cylindrical through hole with an opening diameter D2 of 60 μm.

In the laminate (printed wiring board) of Comparative Example 2 thus manufactured, the through hole was blocked near the opening and had a large cavity inside. The thickness of plated copper 3c was thus insufficient.

Comparative Example 3

A laminate (printed wiring board) of Comparative Example 3 was obtained in the same manner as Example 1, except that a double-sided copper clad laminate was used which had a 250 μm-thick insulating layer; a conical section 8a had a depth d1 of 200 μm; and a cylindrical section 8b had a depth d2 of 50 μm and an opening diameter D2 of 50 μm.

In the laminate (printed wiring board) of Comparative Example 3 thus manufactured, a through hole 8 was blocked near the opening and had a large cavity inside. The thickness of plated copper (conductor) 3c was thus insufficient.

(Presence or Absence of Void)

A filling of the through hole in the laminate according to the examples and comparative examples was evaluated based on the presence or absence of a void. Table 1 shows the results. No void was observed in the laminates where the conical section 8a had a depth d1 in a range of 30 to 150 μm, the cylindrical section 8b had a depth d2 in a range of 30 to 50 μm, an opening diameter D2 in a range of 30 to 60 μm, and an aspect ratio of 1 or less, and the insulating resin 2 had a thickness d in a range of 60 to 200 μm. On the other hand, a void was observed in Comparative Examples 1 to 3. Thus, the fillings in Examples 1 to 4 of the present invention all achieved good results.

TABLE 1

| | | | | unit (μm) | |
|---|---|---|---|---|---|
| | d1 | d2 | D2 | Aspect Ratio of Cylindrical Section (d2/D2) | Total Laminate Thickness (d1 + d2) | Filling Evaluation ○: with no cavity (void) x: with cavity (void) |
| Example 1 | 100 | 50 | 50 | 1.0 | 150 | ○ |
| Example 2 | 30 | 30 | 30 | 1.0 | 60 | ○ |
| Example 3 | 150 | 50 | 50 | 1.0 | 200 | ○ |
| Example 4 | 150 | 40 | 60 | 0.7 | 190 | ○ |
| Comparative Example 1 | 60 | 90 | 60 | 1.5 | 150 | x |
| Comparative Example 2 | — | — | 60 | — | 170 | x |
| Comparative Example 3 | 200 | 50 | 50 | 1.0 | 250 | x |

(Effects of the Present Embodiment)

The invention according to the present embodiment has the following effects.

(1) The printed wiring board according to the present embodiment includes the insulating resin 2, the plated copper 3a formed on the front surface 2a side of the insulating resin 2, and the plated copper 3b formed on the back surface 2b side of the insulating resin 2. The plated copper 3a and 3b are electrically connected via the plated copper 3c that fills the through hole 8 penetrating the insulating resin 2 from the front surface 2a side to the back surface 2b side. Furthermore, the through hole 8 includes the conical section 8a and the cylindrical section 8b. The conical section 8a has the opening diameter decreasing from the front surface 2a side to the back surface 2b side of the insulating resin 2, and has a minimum opening diameter section (bottom surface). The cylindrical section 8b communicates with the conical section 8a at the minimum opening diameter section.

According to such a configuration, the through hole 8 is formed such that the cylindrical section 8b has a surface on which an electronic component that requires high-density wiring is to be implemented. This reduces the diameter of a land pattern of a wiring led-out portion on the cylindrical section 8b side. In addition, the through hole 8 is reliably plugged with a small amount of the plated copper 3, and hence a via is formed immediately above the through hole 8. Thus, a circuit design of a high-density printed wiring board becomes feasible.

In addition, the through hole 8 of the present embodiment is obtained by successively forming the conical section 8a and the cylindrical section 8b from one surface side (for example, the front surface 2a side). This allows the through hole 8 to be formed with higher positional accuracy than a conventional technology where the printed wiring board is machined in directions from both the front and back surfaces to form a through hole. Moreover, the cylindrical section 8b is plugged with the plated copper 3c without a cavity formed therein, and hence connection reliability can be improved.

(2) In the present embodiment, the portion of the insulating resin 2 where the through hole 8 is formed may have a thickness d in a range of 60 μm or more to 200 μm or less.

This configuration further may improve the efficiency of filling the through hole 8 with the plated copper 3c, and/or may increase connection reliability.

(3) In the present embodiment, the cylindrical section 8b may have an opening diameter D2 in a range of 30 μm or more to 60 μm or less, a length d2 in the thickness direction of the insulating resin 2 in a range of 30 μm or more to 60 μm or less, and an aspect ratio (the length d2/the opening diameter D2) of 1 or less.

This configuration may further improve the efficiency of filling the through hole 8 with the plated copper 3c, and/or more reliably achieve connection reliability.

(4) According to the present embodiment, the method of manufacturing the printed wiring board includes steps of forming the through hole 8 using laser beam machining, and then filling the through hole 8 with the plated copper 3c using electro copper plating, to make the plated copper 3a and the plated copper 3b electrically connected.

Figure 3A:
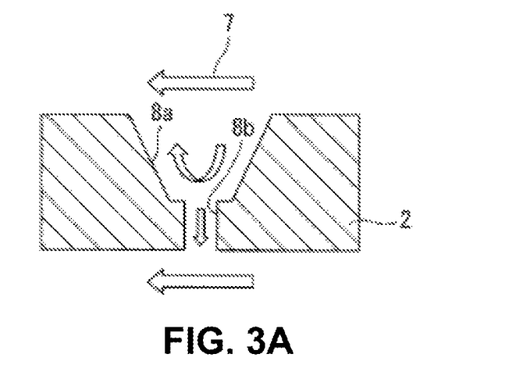
FIGS. 3A through 3C illustrate circulation of a plating solution in a through hole.

As shown in FIG. 3A, the through hole 8 of the present embodiment has a section of conical shape (tapered shape) whose opening diameter decreases from the front surface 2a side toward the back surface 2b side of the insulating resin 2, with the remaining section of the through hole 8 having a cylindrical shape. As is usual for printed wiring boards, a through hole is required to have a reduced diameter only on one surface side (for example, the front surface 2a side), and may have a relatively large diameter on the other surface side (for example, the back surface 2b side). Adopting the conical shape helps to achieve sufficient circulation of a plating solution into the through hole 8, and allows the through hole 8 to be plugged with the plated copper 3c successfully.

Figure 3B:
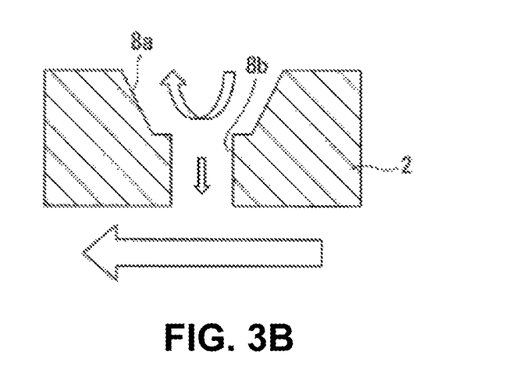
Figure 3C:
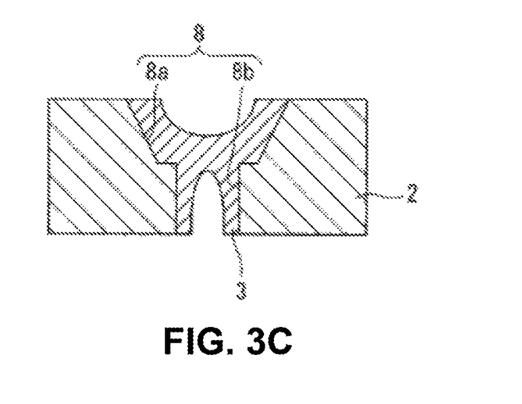

With the structure shown in FIG. 3A, the rate of flow of a plating solution inside the cylindrical section 8b is lower on the conical section side than on the other opening side, as shown in FIG. 3B. Accordingly, as shown in FIG. 3C, the cylindrical section 8b on the conical section 8a side is less affected by an electroplating inhibitor, and is blocked earlier. In FIGS. 3A and 3B, the size of an arrow indicates the rate of flow of a plating solution.

(5) The step of forming the through hole 8 in the present embodiment may include irradiating the insulating resin 2 with a first laser beam from its front surface 2a side to form the conical section 8a, and irradiating the bottom surface of the conical section 8a with a second laser beam from the front surface 2a side of the insulating resin 2 to form the cylindrical section 8b.

This configuration increases the degree of overlap between the conical section 8a and the cylindrical section 8b, in plan view.

(6) The step of forming the through hole 8 in the present embodiment may include, before irradiating the insulating resin 2 with the first laser beam, forming the copper foil 1 in a region of the front surface 2a of the insulating resin 2, except for a region to be irradiated with the first laser beam (that is, except for the through hole-forming region).

With this configuration, the conical section 8a is formed with increased positional accuracy.

Although the present invention has been described with reference to the specific embodiment, the description does not intend to limit the present invention. The disclosed and other embodiments of the present invention will become apparent to those skilled in the art upon reference to the description of the present invention. Accordingly, it should be understood that the appended claims embrace all of these variations or embodiments included in the scope and gist of the present invention.

(Reference)

As a reference for the present invention, a laminate (printed wiring board) that has no technological features described above will now be described briefly.

To meet the demand for miniaturization of electronic equipment in recent years, electronic components have been modularized and highly integrated. Printed wiring boards including these electronic components have also been reduced in area and thickness, and electronic circuits for use in these printed wiring boards are also required to achieve a finer pitch. Accordingly, higher requirements are increasingly being imposed on accuracy and reliability in connection between each printed wiring board and electronic components.

In printed wiring boards currently manufactured, a through hole responsible for establishing interlayer connection usually has a cylindrical shape made by a mechanical drill, or a shape like a truncated cone made by a laser drill so as to have a larger opening area on a machined surface and a smaller opening area on a surface opposite the machined surface.

With a finer pitch and decreased diameter, the through hole may be difficult to fill with a conductor and to achieve a sufficient cross-sectional area of the conductor in the through hole. To avoid these problems, for example, the through hole is filled with a conductor by plating, or an electrically conductive paste is directly squeezed into a wiring board to fill the through hole, to thereby electrically connect the conductive layers. In the wiring boards whose through holes are plugged with a plating, for example, the through holes may have a cylindrical shape (PTL 1), or a shape made of two tapered holes abutting each other (PTL 2).

However, if the through hole above has a cylindrical shape with a small diameter, the through hole may be difficult to fill with an electrically conductive paste, for example. Additionally, in the case of the technique of plugging the through hole with a conductor using plating, a special plating apparatus may be needed due to poor circulation of a plating solution into the through hole. This may reduce efficiency, resulting in low productivity.

If the through hole has a tapered shape, the opening diameter on one surface side is large, making it difficult to achieve a sufficient decrease in diameter.

If the through hole is made of a pair of tapered holes abutting each other, the diameter of a minimum hole diameter section may be small due to a problem with accuracy in aligning the tapered holes on their sides facing each other. As a result, many of the through holes may suffer poor connection.

Detailed description will now be made of a method of manufacturing a laminate (printed wiring board) that includes a through hole 5 made of tapered holes 5a abutting each other, and a method of manufacturing a laminate (printed wiring board) that includes a cylindrical through hole 6.

Figure 4A:
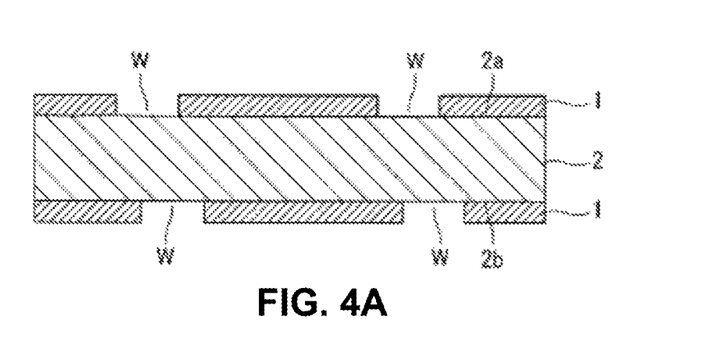
FIGS. 4A through 4C are a set of diagrams illustrating an example conventional method of manufacturing a printed wiring board (partially shown).
Figure 4B:
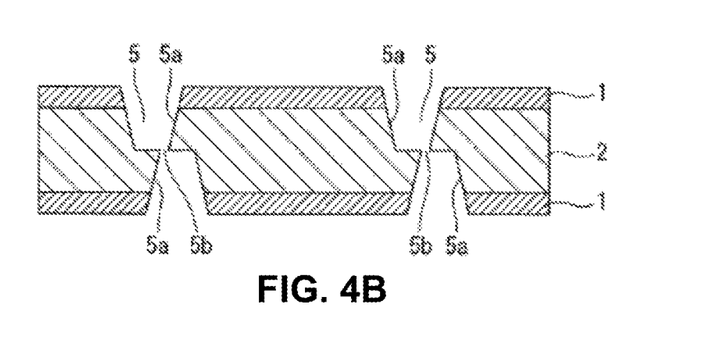
Figure 4C:
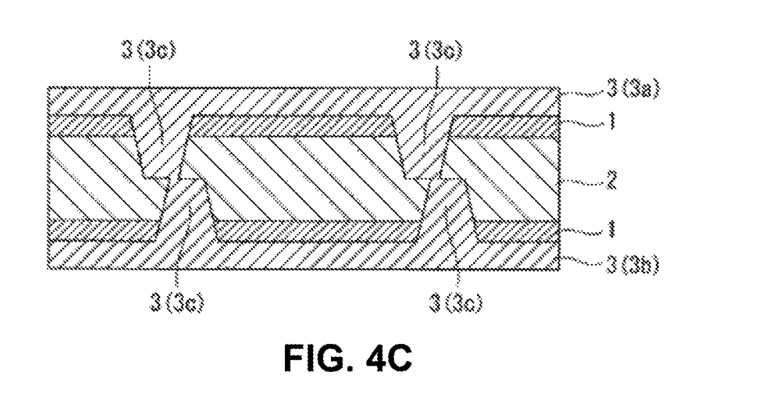

FIGS. 4A through 4C illustrate, in cross section, a conventional method of manufacturing the laminate (printed wiring board) that includes the through hole 5 made of the tapered holes 5a abutting each other.

First, as shown in FIG. 4A, the copper foil 1 is formed on each of the front and back surfaces 2a and 2b of the insulating resin 2, and the copper foil 1a in the through hole-forming region is removed to form a laminate with the window section W. The copper foil 1 in the through hole-forming region is selectively removed by etching, which is a known subtractive process. At this time, as shown in FIG. 4A, depending on accuracy in aligning the window sections W to be formed, the window sections W when formed may be misaligned.

Then, as shown in FIG. 4B, the insulating resin 2 exposed through the window sections W in the copper foil 1 is laser-machined from the front surface 2a side and the back surface 2b side, to form the through hole 5.

As shown in FIG. 4C, the through hole 5 is then filled with the plated copper 3c by electroplating. The through hole 5 may be filled by, for example, a semi-additive or subtractive process.

In manufacturing the laminate (printed wiring board) as described above, if the two window sections W formed on the front surface 2a side and the back surface 2b side of the insulating resin 2 are aligned with low accuracy, the holes (via holes), which have been formed from the front surface 2a side and the back surface 2b side, may be misaligned, distorting the shape of a minimum hole diameter section 5b of the through hole 5, as shown in FIG. 4B. In other words, the diameter of the minimum hole diameter section 5b, which is formed when the holes (via holes) formed from the front surface 2a side and the back surface 2b side are aligned, decreases by an amount of misalignment between the front-side and back-side holes (via holes).

The reduced hole diameter of the minimum hole diameter section 5b may fail to achieve a sufficient cross-sectional area of the plated copper 3c, reducing reliability in electrical conduction.

Figure 5A:
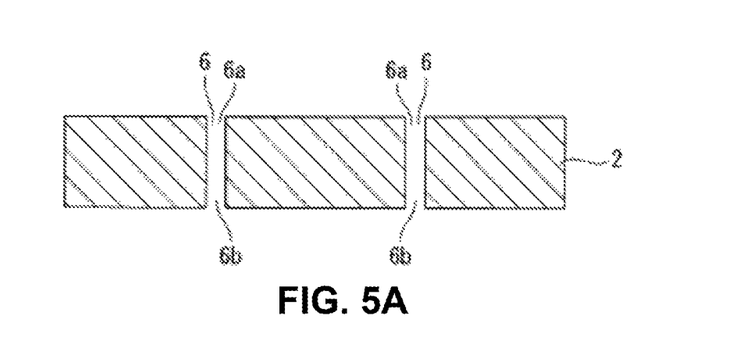
FIGS. 5A and 5B are a set of diagrams illustrating another example conventional method of manufacturing a printed wiring board (partially shown).
Figure 5B:
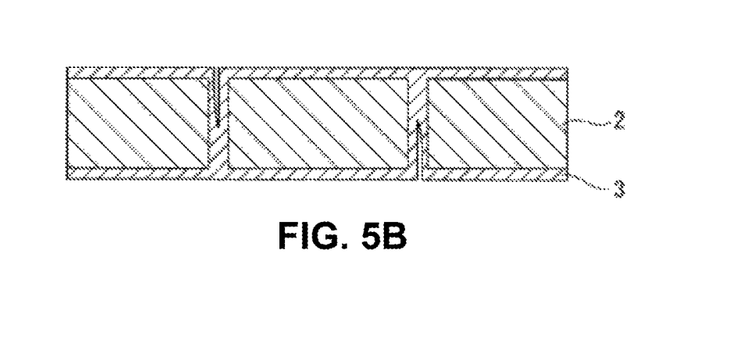

FIG. 5 illustrates a manufacturing method that adopts plugging of a cylindrical through hole 6 using plating.

With the through hole 6 having the shape, if the insulating resin 2 has a thickness exceeding 60 μm, and electroplating, which is a known technology, is used, openings 6a and 6b provided on the front surface 2a side and the back surface 2b side may be blocked earlier than the inside of the through hole 6. This forms a large cavity inside the through hole 6, making a cross-sectional area of the plated copper 3c insufficient, thus reducing reliability in electrical conduction.

INDUSTRIAL APPLICABILITY

With the printed wiring board according to the present invention and the method of manufacturing the same, efficiency of filling a through hole with a conductor increases, and connection reliability can be increased. The printed wiring board according to the present invention is therefore applicable to electronic components that are highly modular and highly integrated.

REFERENCE SIGNS LIST

1: Copper foil, 1a: Copper foil provided in through hole-forming region, 2: Insulating resin, 2a: Front surface of insulating resin, 2b: Back surface of insulating resin, 3: Plated copper, 3a: Plated copper provided on front surface side, 3b: Plated copper provided on back surface side, 3c: Plated copper that fills through hole, 4: Dry film resist, 5: Through hole, 5a: Tapered hole, 5b: Minimum hole diameter section, 6: Through hole, 6a: Opening provided on front surface side, 6b: Opening provided on back surface side, 7: Arrow that represents direction of flow and rate of flow of plating solution, 8: Through hole, 8a: Conical section, 8b: Cylindrical section, D1: Opening diameter of window section, D2: Opening diameter of cylindrical section, d: Thickness of insulating resin, d1: Depth made by first laser beam machining, d2: Depth made by second laser beam machining, W: Window section.

What is claimed is:

1. A printed wiring board, comprising: an insulating layer; a first conductive layer formed on one surface side of the insulating layer; and a second conductive layer formed on another surface side of the insulating layer; wherein the first and second conductive layers are electrically connected via a conductor that fills a through hole penetrating the insulating layer from the one surface side to the another surface; wherein the through hole includes a tapered section whose opening diameter decreases from the one surface to the another surface of the insulating layer, the tapered section having a minimum opening diameter section, and includes a cylindrical section that communicates with the tapered section at the minimum opening diameter section and intersects with the another surface, wherein a thickness of at least part of the conductor varies in accordance with a decrease in opening diameter of the tapered section, wherein an opening of the cylindrical section has a smaller radius of curvature than an opening of the tapered section, wherein the cylindrical section overlaps at least a portion of the tapered section and is structured such that at least part of the conductor is positioned between opposing curved portions of the respective openings of the tapered section and the cylindrical section, which respectively coincide with the one surface and the another surface of the insulating layer, and wherein the conductor has a first recess extended further from the another surface than a second recess extended from the one surface.

2. The printed wiring board according to claim 1, wherein a portion of the insulating layer where the through hole is formed has a thickness in a range of 60 µm or more to 200 µm or less.

3. The printed wiring board of claim 1, wherein
the cylindrical section has an opening diameter in a range of 30 µm or more to 60 µm or less;
the cylindrical section has a length in a thickness direction of the insulating layer in a range of 30 µm or more to 60 µm or less; and,
the cylindrical section has an aspect ratio of the length to the opening diameter of 1 or less.

4. A method of manufacturing the printed wiring board of claim 1, comprising the steps of:
forming the through hole by laser beam machining; and
then filling the through hole using plating to make the first and second conductive layers electrically connected.

5. The method of manufacturing the printed wiring board of claim 4,
wherein the step of forming the through hole includes irradiating the insulating layer with a first laser beam from the one surface of the insulating layer to form the tapered section, and irradiating a bottom surface of the tapered section with a second laser beam from the one surface of the insulating layer to form the cylindrical section.

6. The method of manufacturing the printed wiring board of claim 5,
wherein the step of forming the through hole includes, before irradiating the insulating layer with the first laser beam, forming a metal foil in a region of the one surface of the insulating layer, except for a region to be irradiated with the first laser beam.

7. The printed wiring board of claim 1, wherein: in the tapered section, the opening diameter decreases from the one surface to the another surface of the insulating layer in a thickness direction of the insulating layer, and in the cylindrical section, an opening diameter of the opening increases in a direction from the one surface to the another surface, such a thickness of a second part of the conductor decreases in the direction from the one surface to the another surface.

8. The printed wiring board of claim 1, wherein the tapered section is formed as a conical section.

9. The printed wiring board of claim 1, wherein in a direction orthogonal to the thickness direction of the insulating layer, (i) a distance from a first end side of the part of the conductor positioned between the opposed curved portions to a second end side of the part of the conductor is smaller than (ii) a distance from a first end side of part of the conductor at a maximum opening diameter section of the tapered section to a second end side of the part of the conductor at a maximum opening diameter section.

* * * * *